(12) United States Patent
Su

(10) Patent No.: US 11,099,228 B2
(45) Date of Patent: Aug. 24, 2021

(54) TEST SYSTEM AND METHOD

(71) Applicant: Advantest Corporation, Tokyo (JP)

(72) Inventor: Mei-Mei Su, Mountain View, CA (US)

(73) Assignee: Advantest Corporation, Tokyo (JP)

( * ) Notice: Subject to any disclaimer, the term of this patent is extended or adjusted under 35 U.S.C. 154(b) by 573 days.

(21) Appl. No.: 15/455,064

(22) Filed: Mar. 9, 2017

(65) Prior Publication Data
US 2018/0259572 A1 Sep. 13, 2018

(51) Int. Cl.
*G01R 31/28* (2006.01)

(52) U.S. Cl.
CPC ...... *G01R 31/2834* (2013.01); *G01R 31/2844* (2013.01); *G01R 31/2889* (2013.01); *G01R 31/2891* (2013.01)

(58) Field of Classification Search
CPC .......... G01R 31/2889; G01R 31/28891; G01R 31/2834; G01R 31/2844
USPC .............. 324/750.03–750.07; 438/11, 14–18
See application file for complete search history.

(56) References Cited

U.S. PATENT DOCUMENTS

| | | | |
|---|---|---|---|
| 3,676,777 A * | 7/1972 | Charters .......... | G01R 31/31905 324/754.07 |
| 5,510,993 A | 4/1996 | Williams et al. | |
| 6,008,636 A * | 12/1999 | Miller .................... | G01R 31/01 324/757.01 |
| 6,067,866 A | 5/2000 | Krajec et al. | |
| 6,445,977 B1 * | 9/2002 | Hwang .............. | G01R 31/2808 198/345.1 |
| 6,794,887 B1 | 9/2004 | Nelson et al. | |
| 6,974,335 B1 | 12/2005 | Podpora | |
| 7,046,027 B2 | 5/2006 | Conner | |
| 7,084,659 B2 | 8/2006 | Delucco et al. | |
| 7,443,184 B2 | 10/2008 | Norris | |
| 7,532,023 B2 | 5/2009 | Norris | |
| 7,649,374 B2 | 1/2010 | Fishman et al. | |
| 7,810,006 B2 | 10/2010 | Yao et al. | |
| 7,848,106 B2 | 12/2010 | Merrow | |
| 8,117,480 B2 | 2/2012 | Merrow | |
| 8,217,674 B2 * | 7/2012 | Amaro ............... | G01R 31/2889 324/750.01 |
| 8,350,191 B2 | 1/2013 | Ondricek | |

(Continued)

FOREIGN PATENT DOCUMENTS

| | | |
|---|---|---|
| KR | 101094200 | 12/2011 |
| KR | 1020130111915 | 11/2013 |

*Primary Examiner* — Patrick Assouad
*Assistant Examiner* — Demetrius R Pretlow

(57) ABSTRACT

Presented embodiments facilitate efficient and effective access to a device under test. In one embodiment, a test system comprises: a primitive configured to control testing of a device under test (DUT) and a device interface board (DIB). The device interface board comprises: a loadboard, an environmental control component and a device under test access interface. The loadboard is configured to selectively couple with a device under test and a primitive. The environmental control component is configured to control environmental conditions. The device under test access interface is configured to allow robotic manipulation of the device under test. The manipulation can include selectively coupling the device under test to the loadboard. The device under test access interface can be configured to enable unobstructed access for robotic manipulation of the device under test.

19 Claims, 11 Drawing Sheets

(56) References Cited

U.S. PATENT DOCUMENTS

| | | | |
|---|---|---|---|
| 8,836,363 B2* | 9/2014 | Goel | G01R 1/07342 |
| | | | 324/756.03 |
| 9,285,416 B2* | 3/2016 | Lee | G01R 31/2808 |
| 2001/0038295 A1* | 11/2001 | Kim | B65G 47/911 |
| | | | 324/750.03 |
| 2003/0117162 A1* | 6/2003 | Watts | G01R 31/2851 |
| | | | 324/757.04 |
| 2004/0246013 A1* | 12/2004 | Dejima | G01R 31/2868 |
| | | | 324/750.03 |
| 2005/0200376 A1* | 9/2005 | Yee | G01R 31/2875 |
| | | | 324/750.01 |
| 2007/0040569 A1 | 2/2007 | Gopal et al. | |
| 2007/0096758 A1* | 5/2007 | Kolman | G01R 31/2893 |
| | | | 324/750.19 |
| 2009/0262455 A1 | 10/2009 | Merrow | |
| 2009/0265032 A1* | 10/2009 | Toscano | G11B 17/225 |
| | | | 700/218 |
| 2011/0012632 A1* | 1/2011 | Merrow | G11B 5/4555 |
| | | | 324/750.03 |
| 2012/0132477 A1* | 5/2012 | Cong | B60K 3/04 |
| | | | 180/302 |
| 2012/0136477 A1 | 5/2012 | Merrow et al. | |
| 2014/0015559 A1* | 1/2014 | Lee | G01R 1/0466 |
| | | | 324/756.02 |
| 2015/0028908 A1 | 1/2015 | Kushnick et al. | |
| 2015/0355231 A1* | 12/2015 | Rogel-Favila | G01R 31/26 |
| | | | 324/750.13 |
| 2017/0131346 A1* | 5/2017 | Roberts, Jr. | G01R 31/2865 |

* cited by examiner

1010
Coupling a device interface board (DIB) to a test primitive, wherein the primitive is configured to control testing of a device under test (DUT) and the device interface board is configured to selectively couple with the device under test and the primitive.

1020
Robotically coupling the device under test to the device interface board.

1030
Creating a controllable test environment envelope for the device under test.

1040
Performing testing on device under test.

1050
Robotically decoupling the device under test from the device interface board.

FIG 10

TEST SYSTEM AND METHOD

FIELD OF THE INVENTION

The present invention relates to the field of electronic testing systems.

BACKGROUND OF THE INVENTION

Electronic systems and devices have made a significant contribution towards the advancement of modern society and have facilitated increased productivity and reduced costs in analyzing and communicating information in a variety of business, science, education, and entertainment applications. These electronic systems and devices are typically tested to ensure proper operation. While testing of the systems and devices has made significant advances, traditional approaches are typically expensive and often have limitations with regards to throughput and convenience.

FIG. 1A is a block diagram of an exemplary conventional testing approach. It consists of a large controlled environmental chamber or oven 71 that contains an oven rack 10 and heating and cooling elements 11. The oven rack 10 contains devices under test (DUTs) in a number of loadboard trays 31, 32, 33, 34, 41, 42, 43, and 44. The environmental test chamber 71 has solid walls and a solid door 72 that enclose the test rack 10. The heating and cooling elements 11 can have a wide temperature range (e.g., −10 to 120 degrees C.). The test head 81 contains various racked components, including system controller network switches 52, system power supply components 53, and tester slices 50 (the tester slice contains the tester electronics). The loadboard trays (e.g., 30, 31, etc.) are connected to tester slices 50 (multiple loadboard trays can be coupled to a single tester slice). FIG. 1B is a block diagram of a tester tray 30 and devices under test (e.g., 91, 92, etc.). The loadboard trays are manually populated with devices under test. The full tester trays (e.g., 30, 31, etc.) are manually inserted into environmental chamber 71 and manually connected to the tester electronics (e.g., 50, 52, 53, etc.). This process can be labor intensive and cumbersome (e.g., the process requires opening the door 72 of the environmental chamber 71 and manually trying to insert the trays though the door 72 into the appropriate location). The tester trays are typically tightly stacked on top of one another and even after opening the door, the devices under test are not easily accessible individually. An entire tray usually has to be manually removed first before devices under test can be added or removed.

Conventional systems are not typically well suited for volume production because: 1) the systems are expensive to build and operate; and 2) physical manipulation (e.g., insertion, removal, etc.) of the devices under test is labor intensive. Traditional test system configurations typically require physical manipulation of the devices to be manually performed. Testing devices with different form factors is also usually labor intensive in both the amount of work involved and the difficulty of the work. The amount of work is considerable because the loadboards typically need to be manually removed from the environmental chamber and changed, manually populated with the numerous devices under test and then manually recoupled to the tester slice. The conventional test head and oven enclosure access restrictions and typical hardwired nature of the test slice and loadboard coupling all add to the difficulty of the work.

Other aspects of conventional test approaches also often adversely impact productivity and throughput. In order to physically manipulate devices or change form factors, the entire conventional tester system (e.g., test head, oven, etc.) typically needs to be shut down and the environmental chamber or oven 71 is opened (losing maintenance of environmental conditions). These cumbersome conventional device under test load and unload approaches interrupt testing operations of all the devices under test. These approaches do not typically allow flexible or continued testing of some devices while other devices are physically manipulated. There is a long felt need for a less expensive and convenient volume production electronic device testing approach due to the costs and difficulties associated with manipulating devices under test in traditional systems, including changing from testing devices of one form factor to devices of a different form factor.

SUMMARY

Presented embodiments facilitate efficient and effective access to a device under test. In one embodiment, a test system comprises: a primitive configured to control testing of a device under test (DUT), and a device interface board (DIB). The device interface board comprises: a loadboard, an environmental control component, and a device under test access interface. The loadboard is configured to selectively couple with a device under test and a primitive. The environmental control component is configured to control environmental conditions. The device under test access interface is configured to allow robotic manipulation of the device under test. The manipulation can include selectively coupling the device under test to the loadboard. The device under test access interface can be configured to enable unobstructed access for robotic manipulation of the device under test.

The device interface board and the primitive can be configured to enable continued testing of another device under test during the robotic manipulation of the device under test. In one exemplary implementation, the loadboard is configured to accommodate different device under test form factors and be compatible with a universal interface configuration of the primitive. The loadboard can be accessible for replacement free of hindrance by a solid environmental enclosure. The primitive can be configured to couple with additional device interface boards that have respective device under test access interfaces configured to allow robotic manipulation of additional devices under test. The environmental control component can be configured to create an environmental envelope for the device under test. The environmental envelope can be maintained without interfering with robotic manipulation of the device under test.

In one embodiment, a testing method comprises: coupling a device interface board to a test primitive, wherein the primitive is configured to control testing of a device under test (DUT) and the device interface board is configured to selectively couple with the device under test and the primitive; coupling the device under test robotically to the device interface board; performing testing on device under test; and decoupling the device under test robotically from the device interface board. The coupling and decoupling of the device under test to the device interface board can utilize a device under test access interface. The device under test access interface allows continuous hindrance free robotic access to the device under test selectively coupled to the device interface board. The coupling and decoupling of the device under test to the device interface board can be performed automatically. The method can include performing testing on another device under test while the coupling and decoupling of the device under test to the device interface board is performed. In one exemplary implementation, the coupling of the device interface board to the test primitive is performed as part of operations to accommodate changes in form factors of the device under test to another device under test form factor. The method can include controlling ambient environmental conditions for a device under test. Controlling ambient environmental conditions can comprise creating a controllable test environment envelope for the device under test, wherein the controllable test environment envelope does not interfere with the robotically coupling and robotic decoupling of the device under test.

In one embodiment, a device interface board (DIB) comprises: a loadboard, a device under test access interface, and an environmental control component. The loadboard can be configured to selectively couple with a device under test (DUT) and a primitive. The device under test access interface can allow robotic access to and physical manipulation of the device under test. The environmental control component can be configured to control ambient environmental conditions of the device under test without interfering with the robotic access to and physical manipulation of the device under test. In one exemplary implementation, the device under test access interface is configured with physically open access for robotic manipulation of the device under test free of additional operations to move a barrier portion of the device interface board. The loadboard can include a device under test coupling mechanism and interface that are configured in an orientation that is compatible with the robotic access to and physical manipulation of the device under test. The loadboard can be configured to accommodate multiple device under test form factors and be compatible with a universal interface configuration of the primitive. The loadboard can be configured to accommodate device under test form factors that are different from another loadboard and both loadboards are compatible with a universal interface configuration of the primitive.

DESCRIPTION OF THE DRAWINGS

The accompanying drawings, which are incorporated in and form a part of this specification, are included for exemplary illustration of the principles of the present invention and not intended to limit the present invention to the particular implementations illustrated therein. The drawings are not to scale unless otherwise specifically indicated.

FIG. 10 is a flow chart of a testing method in accordance with one embodiment.

DETAILED DESCRIPTION

Figure 1A:
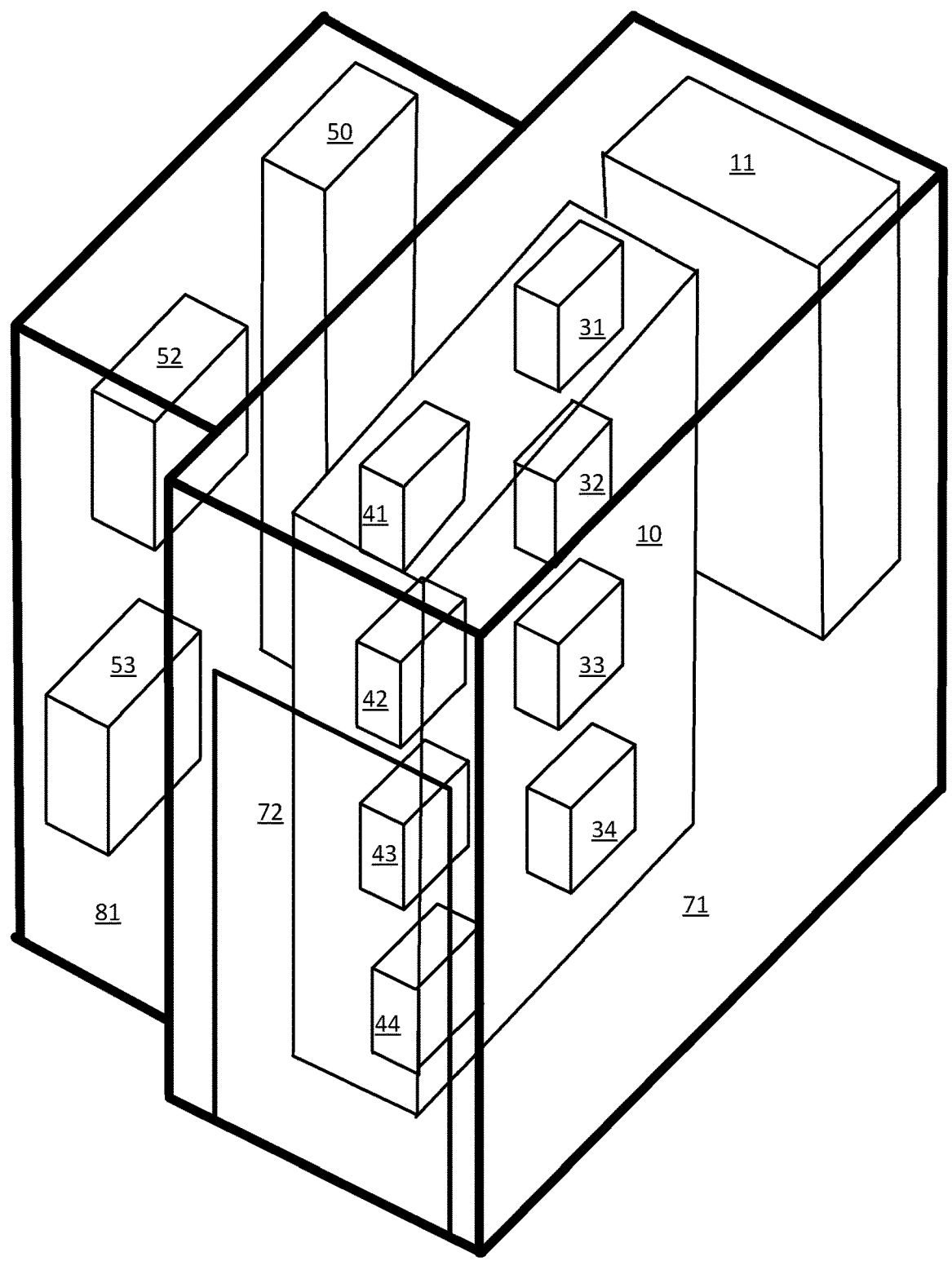
FIG. 1A is a block diagram of a conventional testing approach.
Figure 1B:
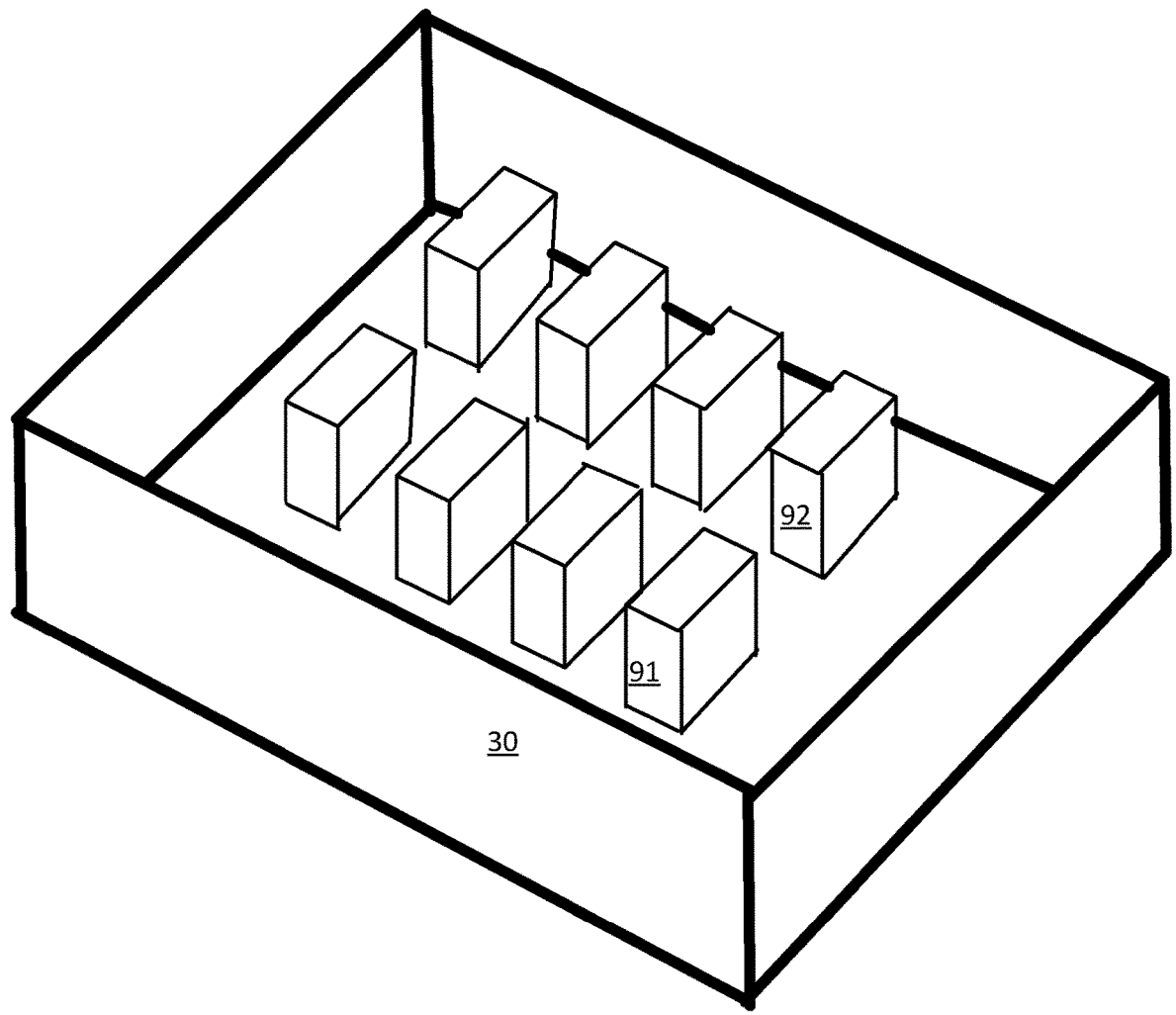
FIG. 1B is a block diagram of a conventional tester tray and devices under test.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Presented embodiments facilitate convenient and efficient testing of electronic devices. Devices under test can be readily manipulated physically (e.g., inserted, removed, relocated, etc.) in device interface boards. In one embodiment, the device interface boards are compatible with robotic manipulation of the devices under test. In one embodiment, a test system includes a device interface board and tester electronics that control testing operations. The tester electronics can be located in an enclosure which together are referred to as the primitive. The device interface board has a device under test access interface that allows physical manipulation of the devices under test. In one exemplary implementation, the device under test access interface is a continuously unobstructed access region. The device under test access interface can be configured with physically open access for robotic manipulation of the device under test without performing additional operations to move a barrier or obstruction. In one embodiment, a device under test can be independently manipulated physically with little or no interference or impacts on testing operations of another device under test.

Device interface boards and their loadboards can be conveniently reconfigured to accommodate different device form factors. In one embodiment, loadboards are configured with device under test interfaces and universal primitive interfaces. The form factor of device under test interfaces can differ from one loadboard to another while the configuration or form factor of the universal primitive interfaces remain similar from one loadboard to another. The device under test interfaces and universal primitive interfaces can include modular connectors that allow easy coupling and decoupling of the device interface board to and from respective devices under test and primitives.

In one embodiment, the device interface board can control an ambient environment of a device under test. In one exemplary implementation, the device interface board can contain environmental control components that create an environmental envelope in which device under test ambient environmental conditions are controlled and maintained. The environmental envelope mitigates or prevents environmental impacts on the devices under test from uncontrolled outside environmental conditions, but does not hinder physical manipulation of the devices under test (e.g., by a robot, other mechanism, etc.). Environmental conditions can be maintained or adjusted by the device interface board during physical manipulation of a device under test.

Figure 2:
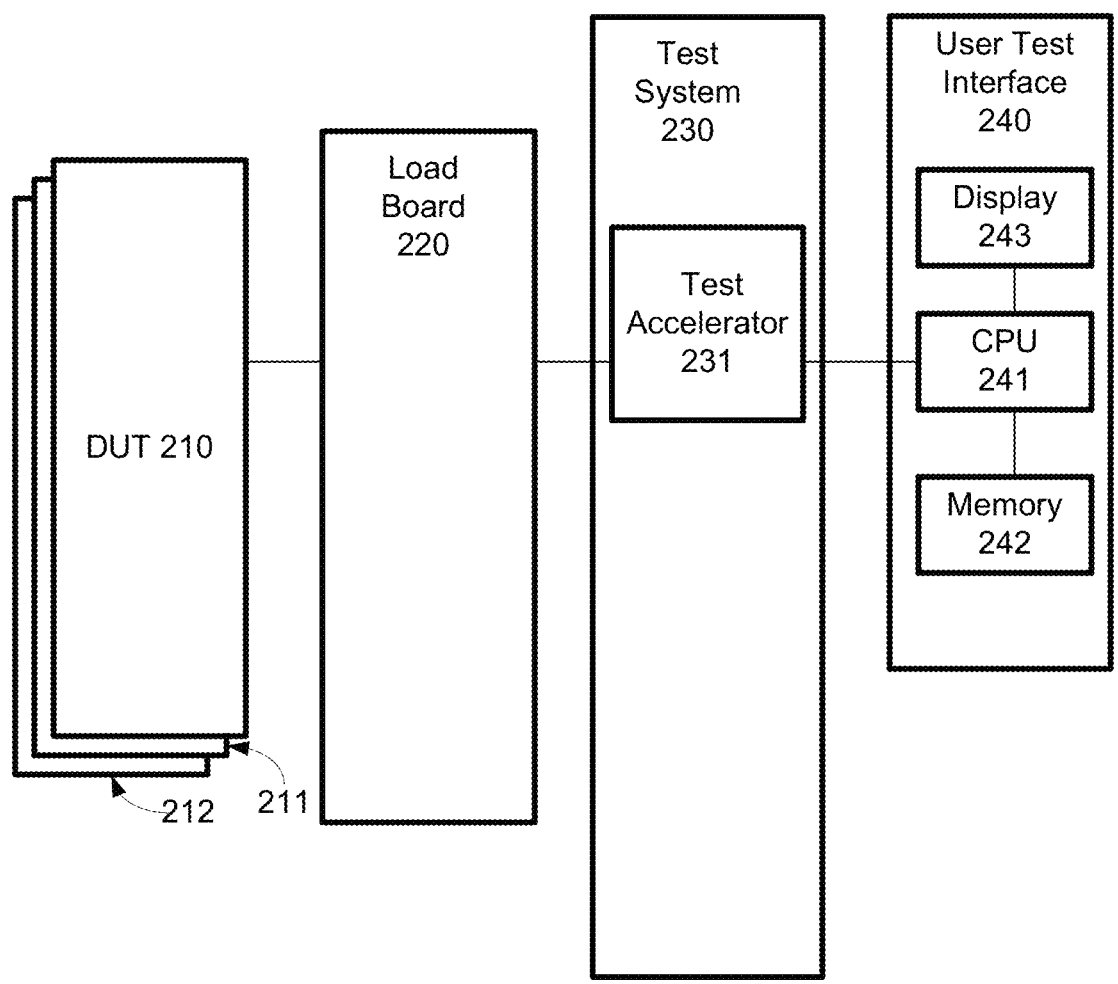
FIG. 2 is a block diagram of an exemplary test environment or system in accordance with one embodiment.

FIG. 2 is a block diagram of an exemplary test environment or system 200 in accordance with one embodiment. The test environment or system 200 includes devices under test (e.g., 210, 211, 212, etc.), loadboard 220, test system 230 and user test interface 240. The devices under test (e.g., 110, 111, 112, etc.) are coupled to the test board or load board 220 which is coupled to test system 230, which in turn is coupled to the user interface 240. User test interface 240 includes CPU 241, memory 242, and display 243. In one embodiment, the test system 230 comprises an FPGA that includes a test accelerator 231. The FPGA is configured to perform preliminary analysis and reconfiguration of persistent test information. Loadboard 220 is configured to electrically and physically couple a device under test to the test system.

Figure 3:
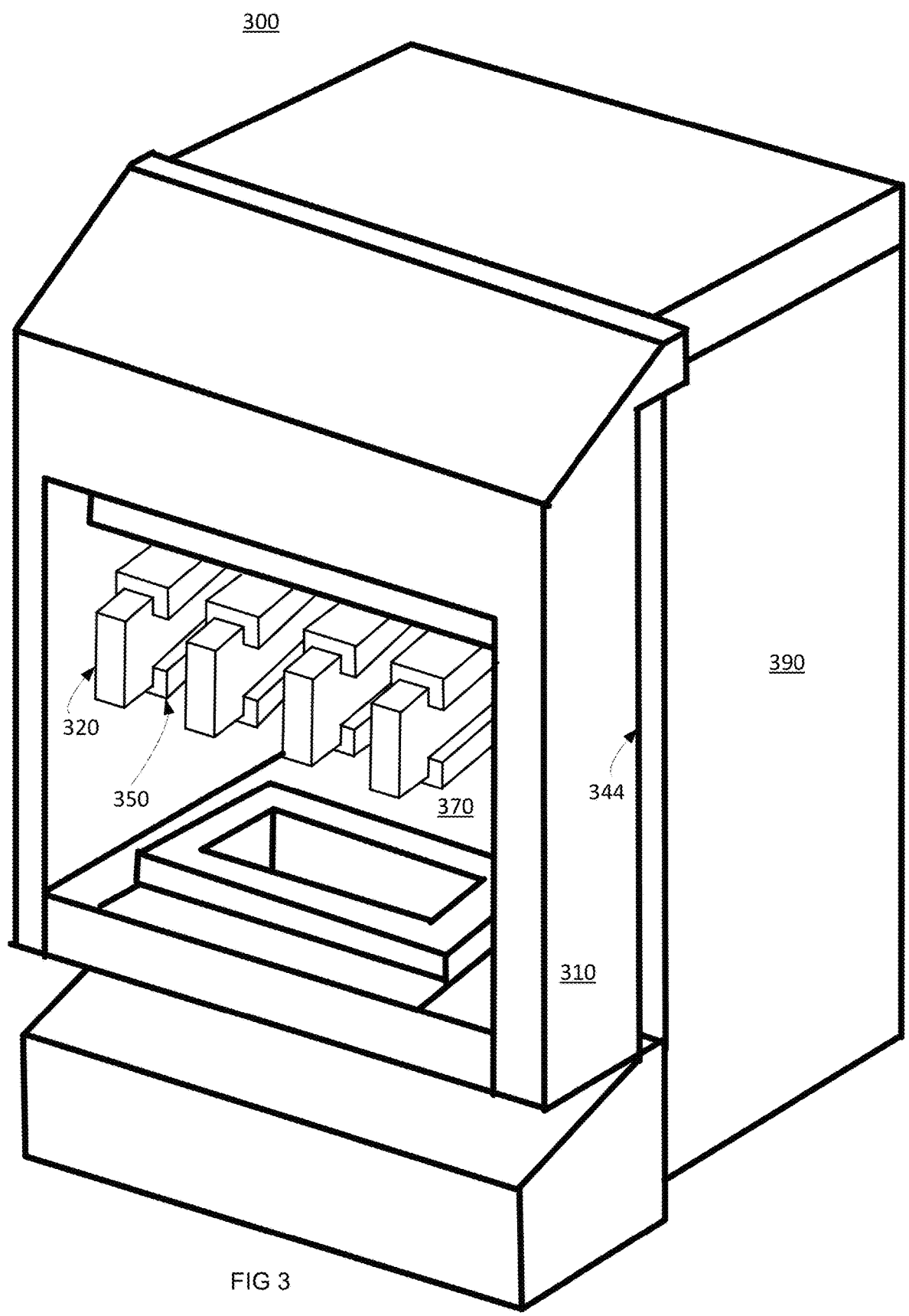
FIG. 3 is a block diagram of an exemplary test system in accordance with one embodiment.

FIG. 3 is a block diagram of an exemplary test system 300 in accordance with one embodiment. Test system 300 includes a testing primitive 390 (e.g., containing the testing control hardware and power supply components for the devices under test, etc.) and a device interface board (DIB) 310 disposed in front of and coupled to the primitive 390. In one embodiment, the device interface board 310 is a partial enclosure and configured to couple with the devices under test 320 placed in coupling mechanism or component 350. In one exemplary implementation, the coupling mechanisms or components are sockets that enable the devices under tests to be coupled to a loadboard included the device interface board 310. The loadboard can be positioned towards the back of the device interface board. The coupling mechanisms or sockets match the form factor of the devices under test being tested. The loadboard is also coupled to and electrically interfaces with the primitive 390 to obtain power and high speed electrical signals for testing the device under test 320. The device interface board can include air flow channels 344 that allow air flow to and from the device under test environment. The air flow channels 344 can include baffles.

The device interface board 310 partial enclosure includes a device under test access interface 370 that enables easy physical access (e.g., unobstructed, unimpeded, etc.) to the devices under test. The device under test access interface 370 can be an access opening in the enclosure of the device interface board 310. The device under test access interface 370 can allow robotic access to and manipulation of devices under test within the device interface board 310 partial enclosure. The device under test access interface 370 can be configured with physically open access for robotic manipulation of the device under test without performing additional operations to move a barrier or obstruction. In one exemplary implementation, the device under test access interface 370 allows access for robotic manipulation of the device under test without performing additional operations to open a door or move other enclosure components, unlike traditional test systems that typically require a door or panel in an oven enclosure to be opened.

Figure 4:
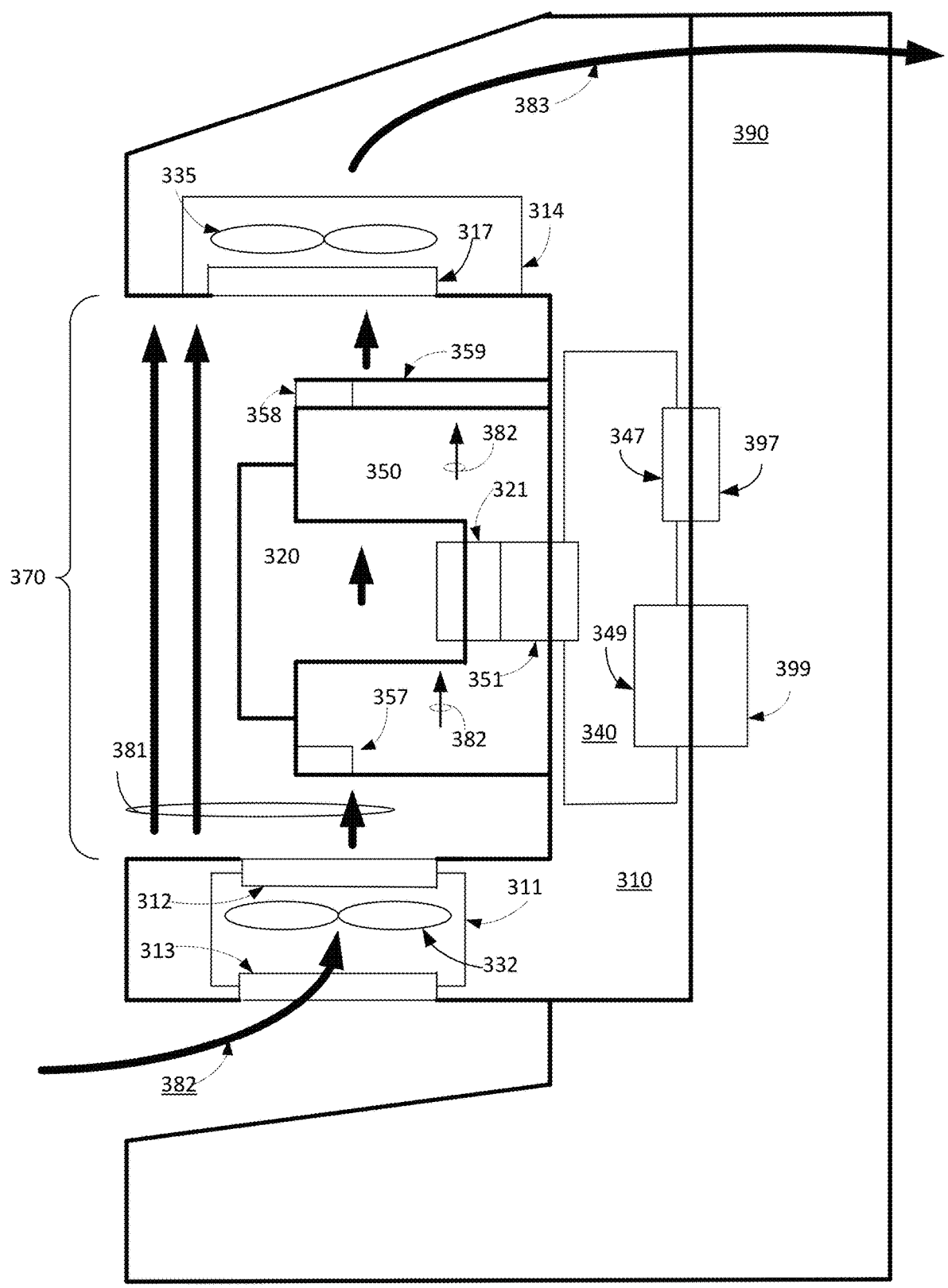
FIG. 4 is a cutaway of an exemplary test system in accordance with one embodiment.

FIG. 4 is a cutaway of exemplary test system 300 in accordance with one embodiment. In addition to device under test access interface 370 and coupling components, the device interface board 310 also includes loadboard 340 and environmental control components 311 and 314. Devices under test (e.g., 320, etc.) are placed in or coupled to coupling components (e.g., 350, etc) which match the form factor of the devices under test. Loadboard 340 includes a device under test interface 357 which electrically couples with the device under test 320 via interfaces 321 (interface 321 is part of the device under test 320). Loadboard 340 also includes interfaces 347 and 349 which electrically couple to the backplane interfaces 397 and 399 of primitive 390. In one exemplary implementation, interfaces 347 and 349 are compatible with a universal interface configuration. In one embodiment, the universal interface configuration allows loadboards that support different configurations of devices under test to be readily compatible with primitive interface form factors that remain constant. Status indicators (e.g., LEDs, etc.) that indicate the testing status for devices under test can also included in the device interface board 310. The status indicator 357 is included or mounted in the coupling component 350 and the status indicator 358 is included in another mechanism or mounting bracket 359. The device under test access interface 370 allows access for physical manipulation of the devices under test.

Environmental control components 311 and 314 control and maintain device under test ambient environmental conditions (e.g., temperature, air flow rate, etc.). The environmental control components can create an environmental envelope. The environmental envelope can prevent or mitigate interference from outside environmental conditions on the operations of devices under test. In one exemplary implementation, an environmental envelope is created by air flow. Environmental control components 311 and 314 can include fans 332 and 335 to produce the air flow. The device interface board can also include baffles (e.g., 313, 312, 317, etc.) that participate in creation of the air flow in an environmental envelope. It is appreciated a variety of baffle configurations (e.g., fixed, adjustable, etc.) can be utilized to create air flow characteristics. In one embodiment, air flow 382 enters environmental control component 311 and the temperature of the air is adjusted (e.g., heated, cooled, etc.) by the environmental control component 311. Environmental control component 311 can also contribute to the environmental adjustment sucking air in and forcing it out to help create air flow 381. In one exemplary implementation, an environmental control component can create different air flow rates (e.g., 381 382, etc.) within the environmental envelope (e.g., using additional fans, adjustable baffles, etc.). The environmental envelope is created and maintained in a manner that does not impede physical access to devices under test, even while continuing to prevent outside environmental interference with the device under test ambient environmental conditions. In one embodiment, the device interface board environmental envelope eliminates the need for a large environmental chamber typically implemented in conventional test systems.

While embodiments are described in which the primitive and device interface board are not included in a large chamber, such as inside an oven or physical environmental enclosure, it is appreciated that embodiments are also compatible for use in a lager chamber or enclosure. In one embodiment, a primitive and device interface board capable of operating outside a large chamber can be readily moved or implemented inside the large chamber if desired.

Figure 5:
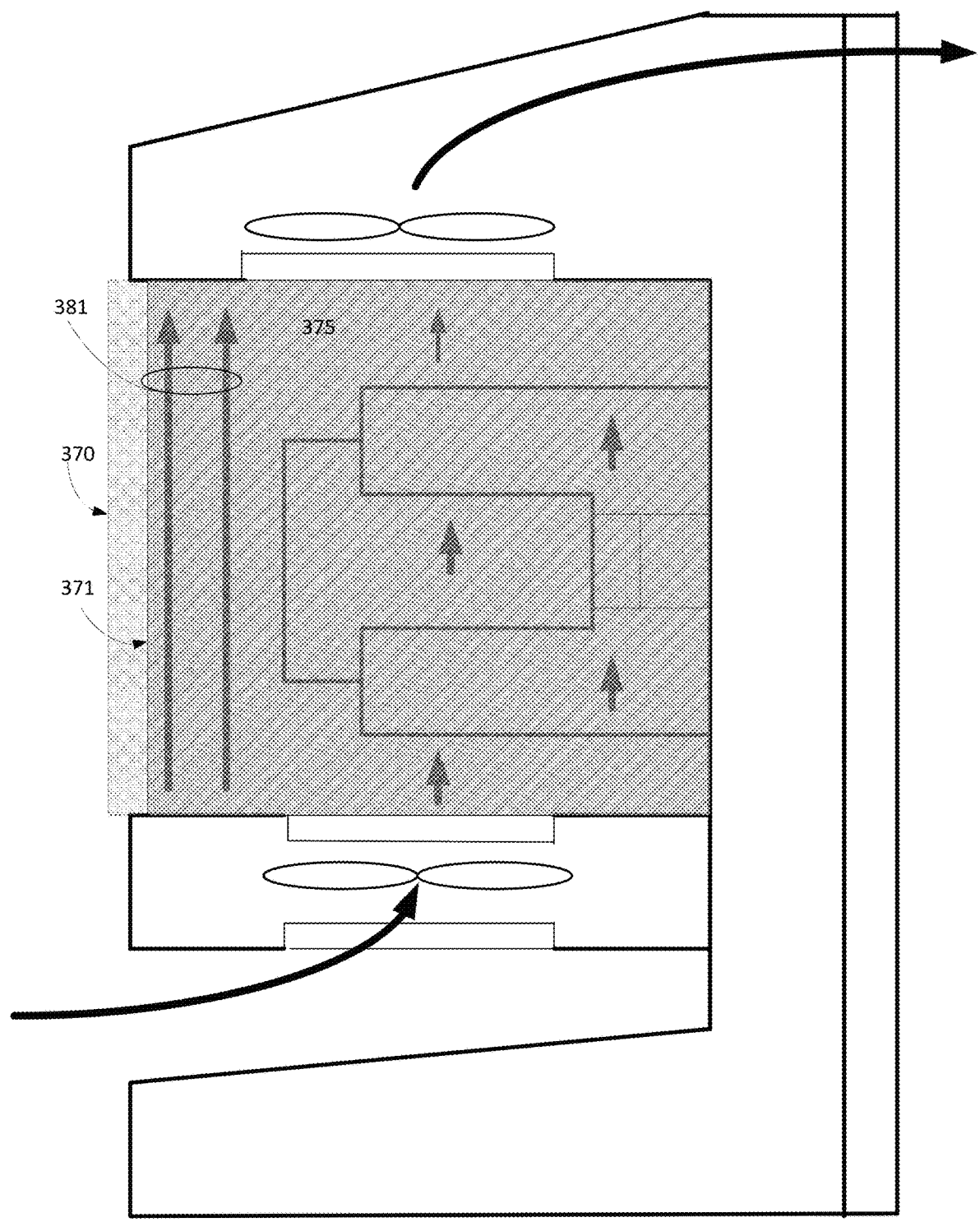
FIG. 5 is a block diagram of an exemplary device interface board with an open access region and environmental envelope.

FIG. 5 is a block diagram of device interface board 310 showing an opening of device under test access region 370 and environmental envelop 375. In one embodiment, the air flow 381 creates an air flow barrier 371 that adequately prevents interference from outside environmental conditions while still permitting easy continuous physical access to the devices under test. In one exemplary implementation, a robotic arm is easily able to penetrate the open access region 370, air flow 381 and environmental envelop 375 to gain access to the devices under test. The robotic arm does not create appreciable interference with the environmental conditions within environmental envelop 375. In one exemplary implementation, the environmental controllers can readily make rapid adjustments (e.g., change temperature, change to the air flow rate, etc.) that enable maintenance of the environmental conditions even while a robotic arm is within the environmental envelope.

Figure 6:
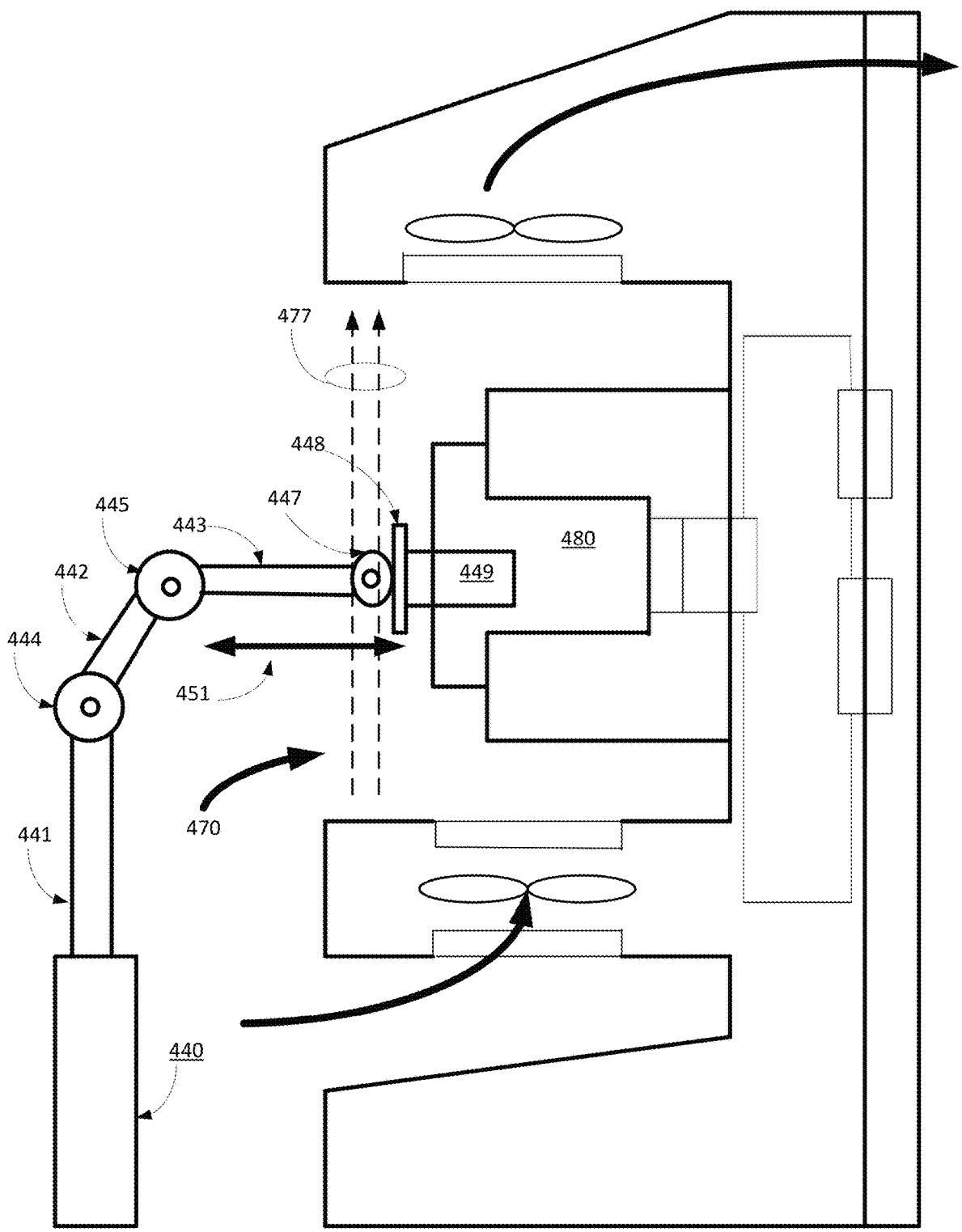
FIG. 6 is a block diagram of an exemplary robotic manipulation component in accordance with one embodiment.

FIG. 6 is a block diagram of an exemplary robotic manipulation component 440 in accordance with one embodiment. Robotic manipulation component 440 can be utilized to manipulate devices under test. In one exemplary implementation, the robotic manipulation component 440 can insert a device under test into a device interface board space and couple the device under test to a loadboard within the device interface board. The robotic manipulation component 440 includes robotic arms 441, 442, and 443, which are coupled to moveable joints 444, 445 and 447 which in turn is coupled to pinion 448 and clamping component 449. The robotic manipulation component 440 can move in direction 451 and easily penetrate the device under test access interface 470 and an environmental envelope, including air flow 477, to grasp and manipulate (e.g., insert, remove, etc.) the device under test 480. The robotic manipulation component 440 access to the device under test 480 is not hindered or impeded by environmental enclosure components (e.g., doors, hatches, device under test orientations, etc). It is appreciated the robotic manipulation component 340 can move in various directions and is not necessarily limited to movement in the direction 451.

In addition to facilitating physical manipulation of multiple devices with the same form factor, device interface boards are readily reconfigurable to handle different form factors of devices under test. The device interface boards are modular and easily coupled to and decoupled from a primitive. In one embodiment, device interface boards can have different form factor interfaces on a device under test side and a universal form factor on a primitive side. A first device interface board can include device under test interfaces that are compatible with a first form factor and a second device interface board can include device under test interfaces that are compatible with a second form factor. Both the first and second device interface boards can include a universal interface configuration that is compatible with a primitive interface. The device interface boards can enable convenient testing of different device form factors unlike traditional systems that are typically hardwired. The device interface board configurations facilitate efficient and effective accommodation of different device under test form factors as compared to conventional approaches. In one exemplary implementation, changing device interface board configurations to accommodate testing of different device under test form factors is not impacted by hard wired and environmental enclosure limitations otherwise typically encountered in traditional test systems.

In one embodiment, a device interface board can support testing of devices having different form factors. To change to a different form factor testing, the loadboard or the device interface board can merely be swapped out with a different loadboard or device interface board. Other components of the system can stay the same (including physical components of the primitive). In one embodiment, a whole device interface board can be easily replaced. In another embodiment, the loadboard is replaced with no other changes to the device interface board or to the primitive. In one embodiment, the loadboard can be easily accessed for physical manipulation (e.g., insertion, removal, etc.) through the device under test access interface.

With reference again to FIG. 4, the loadboard 315 and device interface board 310 are easily removable from the primitive. To test devices of a different form factor, a different loadboard and device interface board is swapped with device interface board 310 but test electronics of the primitive can remain unchanged. In this fashion, by swapping out the loadboard and device interface board, different form factors of device under test can be easily accommodated. In one exemplary implementation, devices under test are solid state drives (SSDs) and different form factors can be accommodated (e.g., such as, SATA 2.5", M.2, U.2, etc.). It is appreciated the test system is compatible with robotic manipulation and testing of various types of components (e.g., network cards, graphics cards, chips, microprocessors, hard disk drives (HDD), and solid state drives (SSD), etc.). In one embodiment, device interface boards and primitives are installed in a rack with a plurality of loadboards and devices under test and multiple devices capable of being selectively tested at the same time. In one exemplary implementation, any of the device interface boards in such a rack can be replaced without causing the entire test system to stop. Further, because of the device under test placement in the device interface board and because no environmental chamber is required, this solution again lends itself to robotic manipulation of the devices under test with respect to the entire rack system. It also lends itself to easier manual manipulation of the devices under test and the loadboard.

Figure 7:
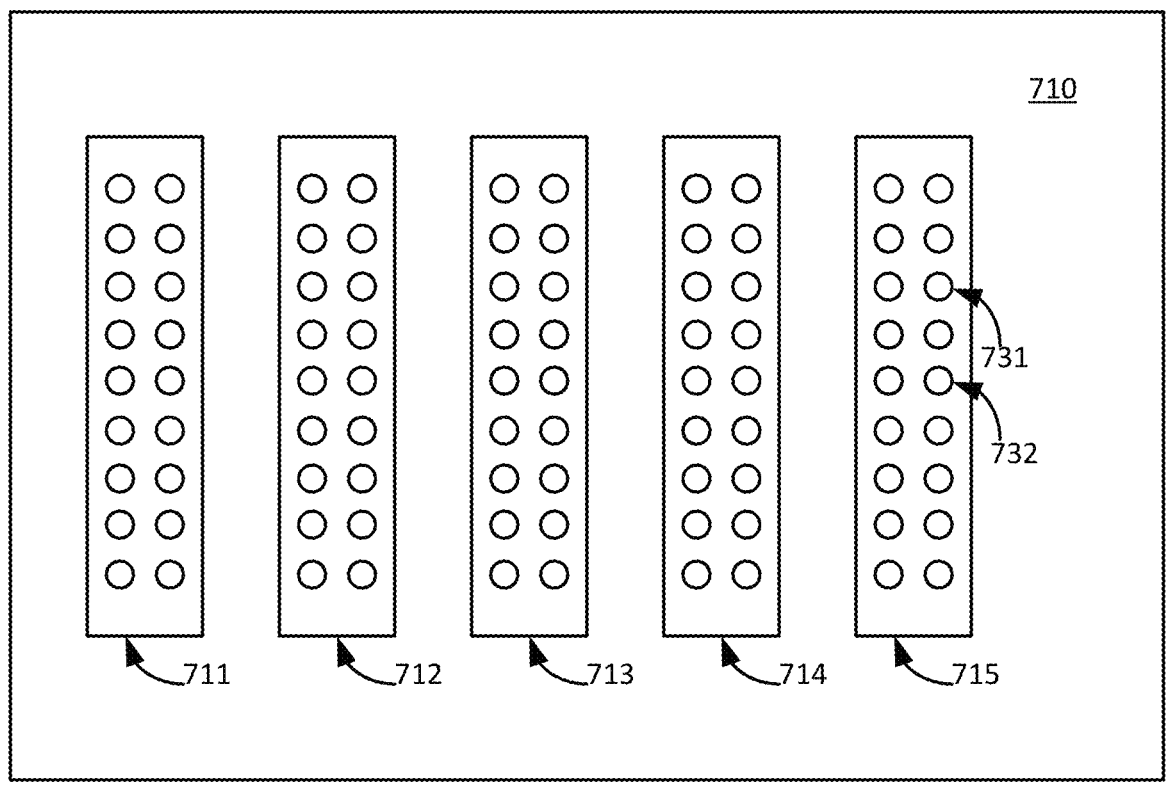
FIG. 7 is a block diagram of an exemplary loadboard interface configuration in accordance with one embodiment.
Figure 7:
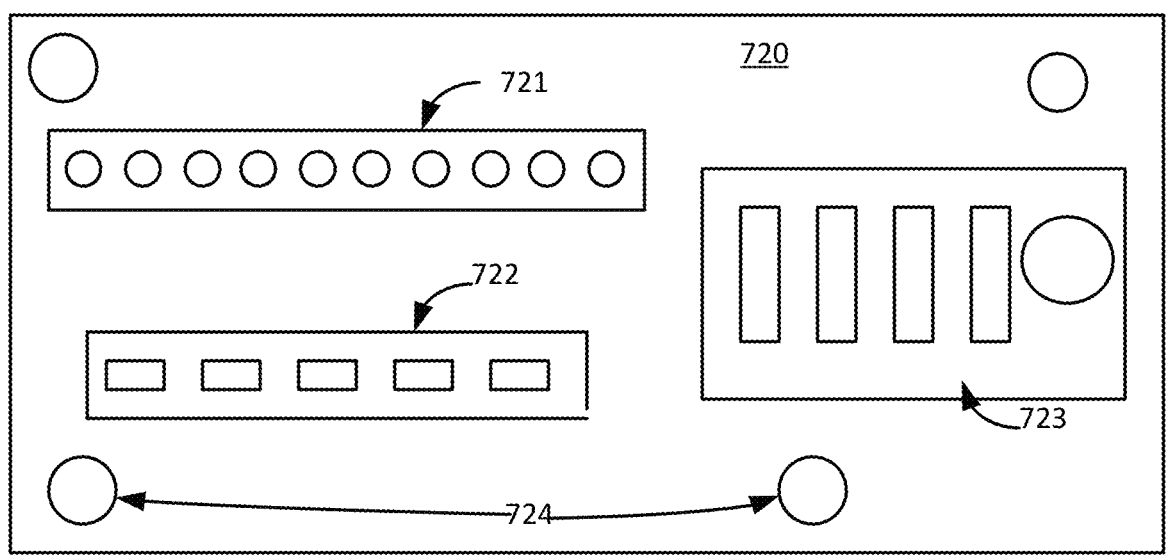

FIG. 7 is a block diagram of an exemplary loadboard interface configuration in accordance with one embodiment. The device under test side 710 of a loadboard interface includes a plurality of loadboard device under test coupling interfaces 711, 712, 713, 714 and 715. In one exemplary implementation, each device under test is coupled to a respective loadboard device under test coupling interface. The loadboard device under test coupling interface (e.g., 715, etc.) includes electrical connection components (e.g., 731, 732, etc.) that convey electrical signals to and from a coupled device under test. The electrical connection components can include a variety of connection mechanisms (e.g., electrical pins, terminals, etc.). The configuration (e.g., size, dimension, number and types of electrical pins, etc.) is compatible with a form factor of a corresponding device under test interface electrically coupled to the loadboard device under test coupling interface.

The device interface board also includes a universal interface 720 for connecting to the backplane of the tester electronics in the primitive. The universal interface includes power connections 723 and high speed electrical connections 721 and 722 (e.g., pin electronics, high speed side band and diagnostic connections, etc). In one embodiment, a side 720 of the loadboard has a universal interface to match the backplane connections respectively of the primitive. In effect the universal interface side of the loadboard mates or couples to the interfaces of the primitive. In one embodiment, alignment components (e.g., 824, etc.) help align the loadboard with the primitive.

Figure 8:
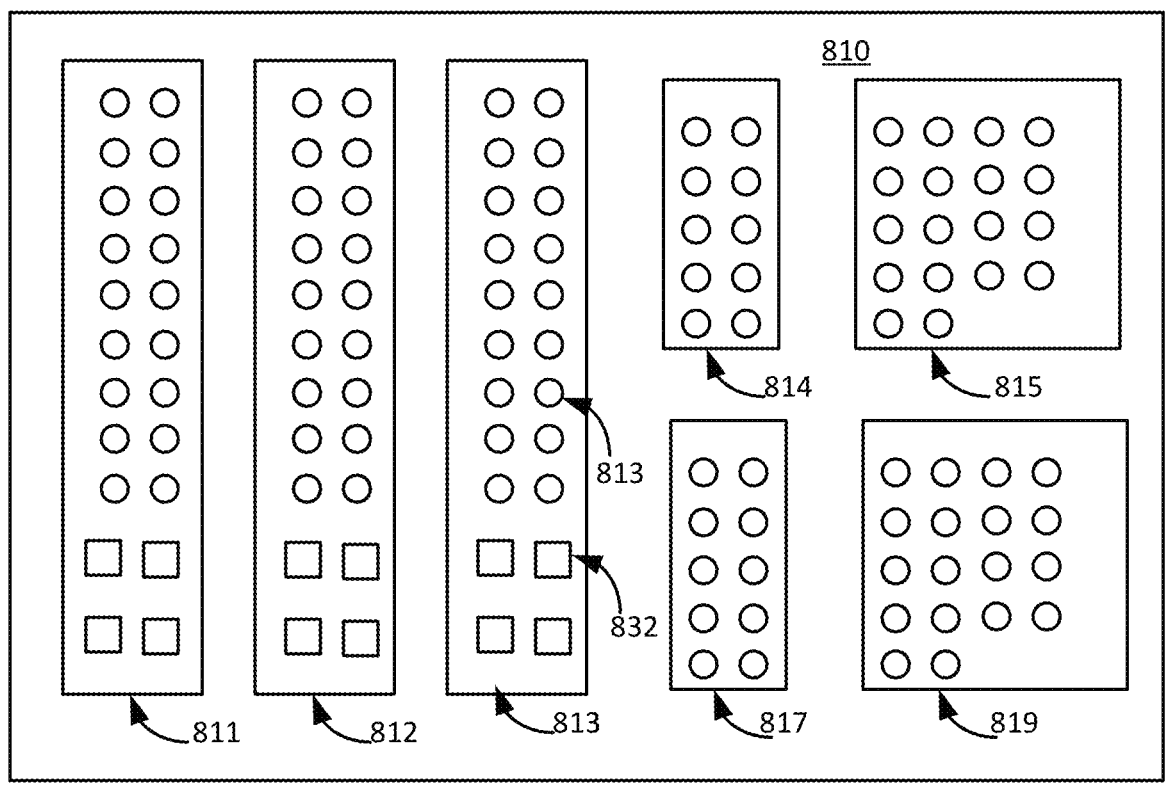
FIG. 8 is a block diagram of another exemplary loadboard interface configuration in accordance with one embodiment.
Figure 8:
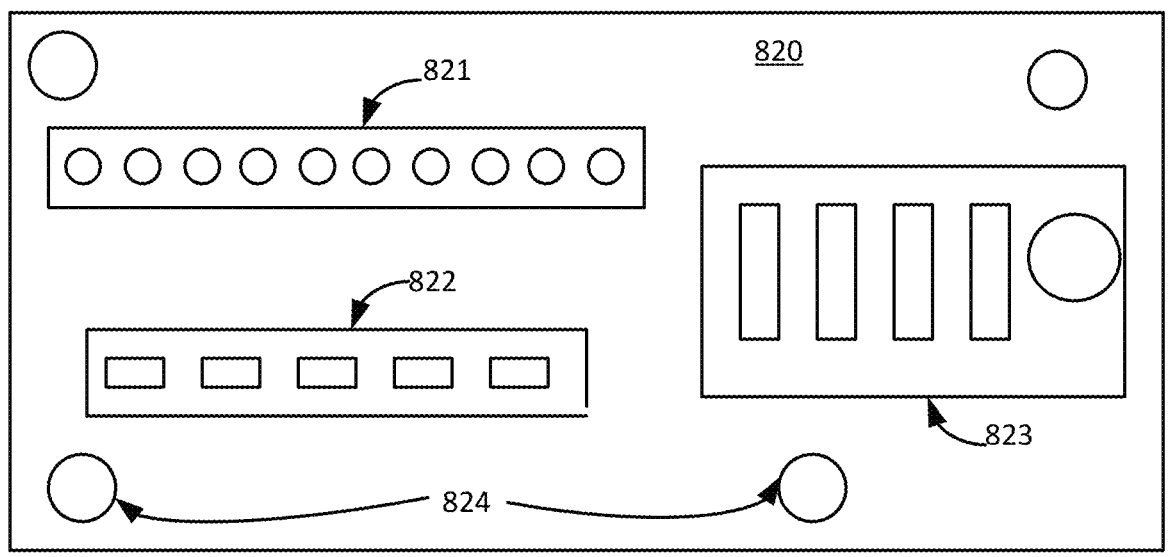

It is appreciated that different form factor devices can be tested. In one embodiment, a loadboard device under test interface side matches the form factor of the device under test to be tested. FIG. 8 is a block diagram of another exemplary loadboard interface configuration in accordance with one embodiment. The device under test 810 of a loadboard interface includes a plurality of loadboard device under test coupling interfaces 811, 812, 813, 814, 815 817 and 819. In one exemplary implementation, each device under test is coupled to a respective loadboard device under test coupling interface. The loadboard device under test coupling interface (e.g., 815, etc.) includes electrical connection (e.g., 831, 832, etc.) that convey electrical signals to and from a coupled device under test. In one embodiment, the form factor configuration (e.g., size, dimension, number and types of electrical pins, etc.) of the loadboard device under test coupling interfaces on side 810 are different from those in side 710 of FIG. 7.

The form factors of the loadboard device under test coupling interfaces can also be different within a loadboard side. On side 810 loadboard device under test coupling interfaces 813, 814 and 815 have different form factor configurations. In one embodiment, a loadboard device under test coupling interface (e.g., 813, etc.) has different types of coupling pins (e.g., 813 and 832). A loadboard can have a plurality loadboard device under test coupling interface rows and columns. In one exemplary implementation, a first row includes loadboard device under test coupling interfaces 814 and 815 and a second row includes loadboard device under test coupling interfaces 817 and 819. A first column includes loadboard device under test coupling interfaces 814 and 817 and a second column includes loadboard device under test coupling interfaces 815 and 819.

Again the device interface board also includes a universal interface 820 for connecting to the backplane of the tester electronics in the primitive. In one embodiment, universal interface 820 is similar to universal interface 720. The universal interface includes power connections 823 and high speed electrical connections 821 and 822 (e.g., pin electronics, high speed side band and diagnostic connections, etc). In effect the universal interface side of the loadboard mates or couples to the interfaces of the primitive. In one embodiment, alignment components (e.g., 824, etc.) help align the loadboard with the primitive.

Figure 9:
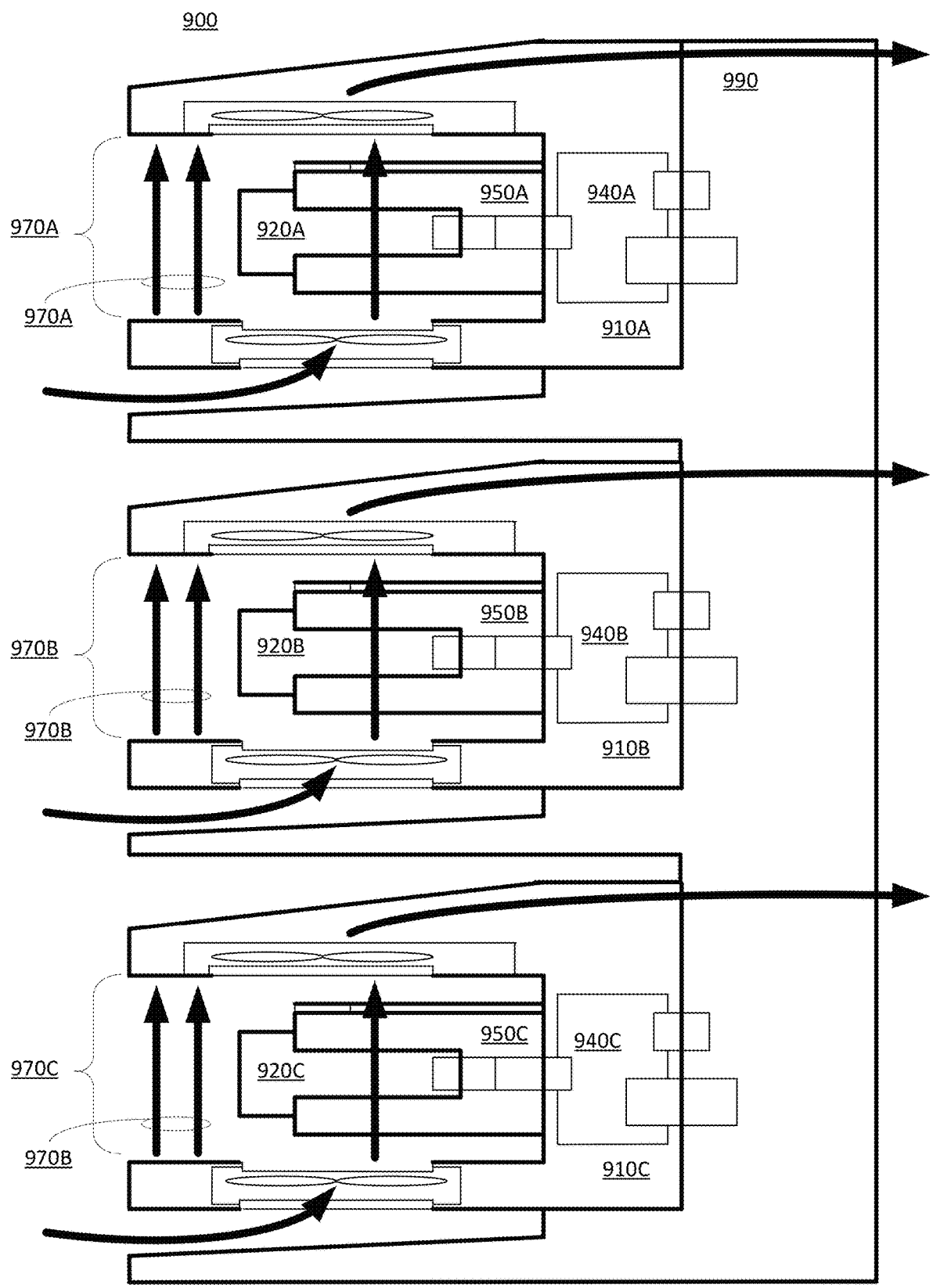
FIG. 9 is a block diagram of an exemplary rack mounted test system in accordance with one embodiment.

FIG. 9 is a block diagram of an exemplary rack mounted test system 900 in accordance with one embodiment. Rack mounted test system 900 includes a plurality of device interface boards (e.g., 910A, 910B, 910C, etc.) rack mounted and coupled to a primitive 990. The individual device interface boards (e.g., 910A, 910B, 910C, etc.) are similar to device interface board 310 and primitive 990 is similar to primitive 390. A device interface board (e.g., 910A, 910B, 910C, etc.) includes a respective loadboard (e.g., 940A, 940B, 940C, etc.), sockets (e.g., 950A, 950B, 950C, etc.), devices under test (e.g., 920A, 920B, 920C, etc.), environmental control components, and device under test access interfaces (e.g., 970A, 970B, 970C, etc.). The device under test access interfaces allow easy access to the devices under test. In one embodiment, the devices under test are readily accessible for robotic manipulation (e.g., insertion, removal, rearrangement, etc.) in the device interface boards. The environmental control components can create independent environment envelopes or thermal bubbles for each DIB. The manipulation of a device under test does not interfere with testing of other devices under test. In one exemplary implementation, a manipulation of a device under test does not require testing operations of other devices under test to be interrupted (e.g., stopped, paused, etc.). In one embodiment, a DIB can also be removed or added without interfering or stopping test operations in other DIBs.

The term device under test is used to refer to a device that is a target of testing. It is appreciated that that one of ordinary skill in the art recognizes the term device under test can be used to describe devices undergoing testing, devices waiting to be tested or devices that have completed testing.

FIG. 10 is a flow chart of a testing method in accordance with one embodiment.

In block 1010, a device interface board is coupled to a test primitive, wherein the primitive is configured to control testing of a device under test, and the device interface board is configured to selectively couple with the device under test and the primitive. The coupling of the device interface board to the test primitive can be performed as part of operations to accommodate changes in form factors of the device under test to another device under test form factor.

In block 1020, the device under test is robotically coupled to the device interface board. The robotic coupling of the device under test to the device interface board can utilize a device under test access interface configured to allow continuous hindrance free robotic access to the device under test selectively coupled to the loadboard. The robotic coupling of the device under test to the device interface board can be performed automatically.

In block 1030, a controllable test environment envelope is created for the device under test. In one embodiment, controlling ambient environmental conditions comprises creating a controllable test environment envelope for the device under test, wherein the controllable test environment envelope does not interfere with the robotically coupling and robotic decoupling of the device under test. In one exemplary implementation, creating a controllable test environment envelope for the device under test comprises creating an air flow that mitigates outside environmental interference on the ambient conditions for a device under test. The ambient temperature conditions for a device under test can be changed or altered while the device under test is robotically coupled and decoupled to and from the device under test.

In block 1040, the device under test is tested. It is appreciated the present method is compatible with a variety of difference tests. In one embodiment, testing on another device under test is performed while the coupling and decoupling of the device under test to the device interface board is performed.

In block 1050, the device under test is robotically decoupled from the device interface board. The robotic decoupling of the device under test to the device interface board utilizes a device under test access interface configured to allow continuous hindrance free robotic access to the device under test selectively coupled to the loadboard. The robotic decoupling of the device under test to the device interface board can be performed automatically.

While the presented device under test access interfaces can facilitate robotic access to devices under test, it is appreciated that access to the devices under test or loadboards is not necessarily limited to robotic manipulation. Even if robotic manipulation is not performed, the device under test access interfaces lend themselves to easier manual swapping of loadboards since the access is unobstructed and they are not located within a completely enclosed environmental chamber.

Thus, embodiments of the present invention can facilitate efficient and effective testing with convenient device under test manipulation while controlling device under test ambient environmental conditions. In one embodiment, the embodiments facilitate independent physical manipulation of devices under test while testing operations continue uninterrupted in other devices under test. The device interface board can readily support multiple form factors of devices under test without altering other testing electronic components (e.g., primitives, other device interface boards, etc.). Further, since the device under test access interfaces facilitate easy access to the devices under test and a physically enclosed environmental chamber is not required, the invention lends itself to robotic device under test manipulation and low cost volume production testing. Even if robotic manipulation is not performed, the invention lends itself to easier manual swapping of devices under test and loadboards since they are not located within an environmental chamber.

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

It is appreciated that embodiments of the present invention can be compatible and implemented with a variety of different types of tangible memory or storage (e.g., RAM, DRAM, flash, hard drive, CD, DVD, etc.). The memory or storage, while able to be changed or rewritten, can be considered a non-transitory storage medium. By indicating a non-transitory storage medium it is not intend to limit characteristics of the medium, and can include a variety of storage mediums (e.g., programmable, erasable, nonprogrammable, read/write, read only, etc.) and "non-transitory" computer-readable media comprises all computer-readable media, with the sole exception being a transitory, propagating signal.

It is appreciated that the following is a listing of exemplary concepts or embodiments associated with the novel approach. It is also appreciated that the listing is not exhaustive and does not necessarily include all possible implementation. The following concepts and embodiments can be implemented in hardware. In one embodiment, the following methods or process describe operations performed by various processing components or units. In one exemplary implementation, instructions, or directions associated with the methods, processes, operations etc. can be stored in a memory and cause a processor to implement the operations, functions, actions, etc.

It is appreciated that a memory storage management systems and methods can include the following exemplary concepts or embodiments. It is also appreciated that the listing is not exhaustive and does not necessarily include all possible implementations. The following concepts and embodiments can be implemented in hardware, firmware, software, and so on. In one embodiment, the following concepts include methods or processes that describe operations performed by various processing components or units. In one exemplary implementation, instructions or directions associated with the methods, processes, operations etc. can be stored in a memory and cause a processor to implement the operations, functions, actions, etc.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. The listing of steps within method claims do not imply any particular order to performing the steps, unless explicitly stated in the claim.

What is claimed is:

1. A test system comprising:
   a primitive configured to control testing of a device under test (DUT); and
   a device interface board (DIB), wherein the device interface board comprises:
   a loadboard configured to selectively couple with a device under test and the primitive;
   an environmental control component configured to control environmental conditions; and
   a device under test access interface configured to allow robotic manipulation of the device under test, wherein the manipulation includes moving the DUT through the device under test access interface and selectively coupling the device under test to the loadboard by a same robotic mechanism,
   wherein the device interface board and the primitive are configured to enable continued testing of another device under test on the loadboard during the robotic manipulation of the device under test through the device under test access interface, wherein a portion of the testing of the device under test is concurrently performed with a portion of the testing of the other device under test.

2. The test system of claim 1, wherein the device under test access interface is configured to enable unobstructed access for robotic manipulation of the device under test.

3. The test system of claim 1, wherein the loadboard is configured to accommodate different device under test form factors and be compatible with a universal interface configuration of the primitive.

4. The test system of claim 1, wherein the loadboard is accessible for replacement free of hindrance by a solid environmental enclosure.

5. The test system of claim 1, wherein the primitive is configured to couple with additional device interface boards that have respective device under test access interface configured to allow robotic manipulation of additional devices under test.

6. The test system of claim 1, wherein the environmental control component is configured to create an environmental envelope for the device under test.

7. The test system of claim 1, wherein the environmental control component is configured to maintain an environmental envelope without interfering with robotic manipulation of the device under test.

8. A testing method comprising:
coupling a device under test (DUT) robotically to a device interface board (DIB), wherein the device under test is coupled directly to a coupling socket of the device interface board, wherein the device interface board includes a loadboard that is coupled to a test primitive, wherein the test primitive is configured to control testing of the device under test and the device interface board is configured to selectively couple with the device under test and the primitive;
performing testing on device under test; and
decoupling the device under test robotically from the device interface board, wherein the device interface board and the primitive are configured to enable continued testing of another device under test on the loadboard during the coupling and decoupling of the device under test robotically by a single robotic mechanism through a device under test access interface, wherein a portion of performing testing on the device under test is concurrently performed with a portion of the testing on the other device.

9. The testing method of claim 8, wherein the coupling and decoupling of the device under test to the device interface board utilizes a device under test access interface configured to allow continuous hindrance free robotic access to the device under test selectively coupled to the device interface board.

10. The testing method of claim 8, wherein the coupling and decoupling of the device under test to the device interface board is performed automatically.

11. The testing method of claim 8, further comprising performing testing on another device under test coupled to another DIB while the coupling and decoupling of the device under test to the device interface board is performed.

12. The testing method of claim 8, wherein coupling of the device interface board to the test primitive is performed as part of operations to accommodate change in form factor of the device under test to another device under test form factor.

13. The testing method of claim 8, further comprising controlling ambient environmental conditions for a device under test.

14. The testing method of claim 13, wherein controlling ambient environmental conditions comprises creating a controllable test environment envelope for the device under test, wherein the controllable test environment envelope does not interfere with the robotically coupling and robotic decoupling of the device under test.

15. A test system comprising:
a device interface board (DIB), including a loadboard configured to selectively couple with a device under test (DUT) and a primitive;
a device under test access interface configured to allow robotic access to and physical manipulation of the device under test, wherein the manipulation includes moving the DUT through the device under test access interface and selectively coupling the device under test to the loadboard by a single robotic mechanism, wherein the device interface board and the primitive are configured to enable continued testing of another device under test on the loadboard during the robotic manipulation of the device under test through the device under test access interface, wherein a portion of performing testing on the device under test is concurrently performed with a portion of the testing of the other device under test; and
an environmental control component configured to control ambient environmental conditions of the device under test without interfering with the robotic access to and physical manipulation of the device under test.

16. The test system of claim 15, wherein the device under test access interface is configured with physically open access for robotic manipulation of the device under test free of additional operations to move a barrier portion of the device interface board.

17. The test system of claim 15, wherein the loadboard comprises a device under test coupling mechanism and interface that are configured in an orientation that is compatible with the robotic access to and physical manipulation of the device under test.

18. The test system of claim 15, wherein the loadboard is configured to accommodate multiple device under test form factors and be compatible with a universal interface configuration of the primitive.

19. The test system of claim 15, wherein the loadboard is configured to accommodate device under test form factors that are different from another loadboard and both loadboards are compatible with a universal interface configuration of the primitive.

* * * * *